United States Patent
Hurd

(10) Patent No.: US 11,408,528 B2
(45) Date of Patent: Aug. 9, 2022

(54) DIGITAL VALVE CONTROLLERS AND SEAL WASHER ASSEMBLIES FOR USE WITH DIGITAL VALVE CONTROLLERS

(71) Applicant: FISHER CONTROLS INTERNATIONAL LLC, Marshalltown, IA (US)

(72) Inventor: Ronald F. Hurd, Marshalltown, IA (US)

(73) Assignee: FISHER CONTROLS INTERNATIONAL LLC, Marshalltown, IA (US)

( * ) Notice: Subject to any disclaimer, the term of this patent is extended or adjusted under 35 U.S.C. 154(b) by 239 days.

(21) Appl. No.: 16/541,871

(22) Filed: Aug. 15, 2019

(65) Prior Publication Data

US 2020/0063884 A1 Feb. 27, 2020

Related U.S. Application Data

(60) Provisional application No. 62/884,126, filed on Aug. 7, 2019, provisional application No. 62/884,120, filed
(Continued)

(51) Int. Cl.
*H05K 5/02* (2006.01)
*F16K 31/02* (2006.01)
(Continued)

(52) U.S. Cl.
CPC .............. *F16K 31/02* (2013.01); *F16J 15/064* (2013.01); *G05D 7/0635* (2013.01); *H01L 41/23* (2013.01);
(Continued)

(58) Field of Classification Search
CPC ......... F16K 31/02; F16K 31/00; F16J 15/064; F16J 15/104; F16J 15/067; G05D 7/0635;
(Continued)

(56) References Cited

U.S. PATENT DOCUMENTS

| 6,501,017 B2 * | 12/2002 | Kaufman | ............. | H05K 9/0001 |
| | | | | 174/152 G |
| 6,963,495 B1 * | 11/2005 | Carullo | ................ | H05K 9/0067 |
| | | | | 174/559 |

(Continued)

FOREIGN PATENT DOCUMENTS

| EP | 2 610 975 A1 | 7/2013 |
| EP | 2 858 183 A2 | 4/2015 |

(Continued)

OTHER PUBLICATIONS

International Search Report and Written Opinion for PCT/US2019/046655, dated Mar. 26, 2020.

*Primary Examiner* — Angel R Estrada
(74) *Attorney, Agent, or Firm* — Marshall, Gerstein & Borun LLP

(57) ABSTRACT

Digital valve controllers and seal washer assemblies for use with digital valve controllers include a seal washer assembly. The seal washer assembly includes a body. The body has a bore. The seal washer assembly includes a flange. The flange is coupled to the body and includes a passage, a face-seal groove, and an exterior-seal groove. The seal washer assembly includes a face seal. The face seal is disposed within the face-seal groove. The seal washer assembly includes an exterior seal. The exterior seal is disposed within the exterior-seal groove.

13 Claims, 15 Drawing Sheets

Related U.S. Application Data on Aug. 7, 2019, provisional application No. 62/720,270, filed on Aug. 21, 2018.

(51) Int. Cl.

| | |
|---|---|
| *F16J 15/06* | (2006.01) |
| *G05D 7/06* | (2006.01) |
| *H05K 5/00* | (2006.01) |
| *H05K 5/06* | (2006.01) |
| *H02B 1/20* | (2006.01) |
| *H01L 41/23* | (2013.01) |
| *H02B 1/06* | (2006.01) |

(52) U.S. Cl.
CPC .............. *H02B 1/063* (2013.01); *H02B 1/20* (2013.01); *H05K 5/0017* (2013.01); *H05K 5/0247* (2013.01); *H05K 5/064* (2013.01)

(58) Field of Classification Search
CPC ......... H01L 41/23; H01L 41/25; H02B 1/063; H02B 1/20; H02B 1/06; H02B 1/26; H02B 1/30; H05K 5/0017; H05K 5/0247; H05K 5/064; H05K 5/00; H05K 5/02; F15B 13/0857; F15B 13/0846; H01R 13/5202; H01R 13/5219; H01R 13/5205

USPC ....... 174/520, 50, 17 R, 135, 539, 554, 559, 174/137 R, 138 R, 152 R, 152 G; 16/2.1, 16/2.2

See application file for complete search history.

(56) References Cited

U.S. PATENT DOCUMENTS

| | | | |
|---|---|---|---|
| 10,630,021 B2* | 4/2020 | Shiraishi | H01R 13/6315 |
| 11,165,189 B2* | 11/2021 | Hashii | H05K 7/1432 |
| 2005/0022712 A1 | 2/2005 | Gundersen | |
| 2005/0176295 A1 | 8/2005 | Morita et al. | |
| 2006/0240710 A1 | 10/2006 | Kato et al. | |
| 2010/0323546 A1 | 12/2010 | Penumatcha et al. | |
| 2013/0206445 A1 | 8/2013 | Miura et al. | |
| 2014/0361087 A1 | 12/2014 | Lovell | |
| 2018/0019556 A1 | 1/2018 | Yamada et al. | |

FOREIGN PATENT DOCUMENTS

| | | |
|---|---|---|
| EP | 2 218 146 B1 | 7/2016 |
| WO | WO-2019/055746 A1 | 3/2019 |

\* cited by examiner

DIGITAL VALVE CONTROLLERS AND SEAL WASHER ASSEMBLIES FOR USE WITH DIGITAL VALVE CONTROLLERS

FIELD OF THE DISCLOSURE

The disclosure relates generally to digital valve controllers and, more particularly, to digital valve controllers and seal washer assemblies for use with digital valve controllers that are used in process control applications that use combustible gasses as a supply medium.

BACKGROUND

Instruments used in combustible and/or explosive gas process control applications often require conductors to send information from one compartment or device to another compartment or device. These conductors may pass through compartments that may contain combustible and/or explosive gases, which are used as the supply medium. In some cases, the pressure of the supply medium is monitored and transmitted to a remote processor for analysis and/or process control monitoring.

SUMMARY

In accordance with a first example, a digital valve controller includes a main housing. The main housing includes an opening. The digital valve controller includes a terminal box. The terminal box includes an internal surface defining a bore. The bore of the terminal box being aligned with the opening of the main housing. The digital valve controller includes a seal washer assembly. The seal washer assembly is disposed within the bore and includes a body. The body has a bore. The seal washer assembly includes a flange. The flange is coupled to the body and includes a passage, a face-seal groove, and an exterior-seal groove. The seal washer assembly includes a face seal. The face seal is disposed within the face-seal groove. The face seal sealing engages the main housing. The seal washer assembly includes an exterior seal. The exterior seal is disposed within the exterior-seal groove. The exterior seal sealingly engages the internal surface of the terminal box. The seal washer assembly includes an electrical coupling. The electrical coupling extends through the passage of the flange and the bore of the body.

In accordance with a second example, a seal washer assembly includes a body. The body has a bore. The seal washer assembly includes a flange. The flange is coupled to the body and includes a passage, a face-seal groove, and an exterior-seal groove. The seal washer assembly includes a face seal. The face seal is disposed within the face-seal groove. The seal washer assembly includes an exterior seal. The exterior seal is disposed within the exterior-seal groove.

In accordance with a third example, a seal washer assembly includes a body. The body includes a first portion, a second portion, a flange, and defines a bore. The flange is disposed between the first portion and the second portion. The bore includes a pair of longitudinally spaced grooves. The seal washer assembly includes a pair of fasteners. The fasteners are received within corresponding ones of the grooves of the body. The seal washer assembly includes a plug. The plug is disposed within the bore of the body between the fasteners. The plug includes a passage. The seal washer assembly includes an electrical coupling. The electrical coupling extending through the passage of plug and the bore of the body.

In accordance with a fourth example, a method of assembling a seal washer assembly includes positioning an electrical coupling through a passage of a flange of the seal washer assembly and a bore of a body of the seal washer assembly. The electrical coupling includes a first portion and a second portion. The first portion extending from the flange of the seal washer assembly and the second portion extending from the second portion of the seal washer assembly. The method includes coupling connectors to the first portion of the electrical coupling and the second portion of the electrical coupling after the electrical coupling is positioned through the passage of the flange of the seal washer assembly and the bore of the body of the seal washer assembly.

In further accordance with the foregoing first, second, third and/or fourth examples, an apparatus and/or method may further include any one or more of the following:

In accordance with one example, the flange includes a first portion and a second portion. The first portion includes a potting cup and the face-seal groove. Further including potting disposed within the potting cup of the flange and potting disposed within the bore of the body of the seal washer assembly.

In accordance with another example, the body of the seal washer assembly includes an internal surface defining the bore. The internal surface being inwardly tapered toward the flange.

In accordance with another example, the potting cup includes radiused corners.

In accordance with another example, the body of the seal washer assembly is coupled to the flange of the seal washer assembly via a press-fit connection.

In accordance with another example, the flange includes a collar. The collar of the flange receiving the body of the seal washer assembly to form the press-fit connection.

In accordance with another example, the flange includes an external step. The body of the seal washer assembly is received within the step to form the press-fit connection.

In accordance with another example, the flange includes a first portion and a second portion. The first portion including the face-seal groove and the second portion including a coupling groove. The body of the seal washer assembly being received within the coupling groove.

In accordance with another example, the body of the seal washer assembly includes an internal surface that defines the bore. A coupling being formed between the internal surface of the body and the flange.

In accordance with another example, the body of the seal washer assembly includes an internal surface having one or more inwardly extending protrusions. The internal surface of the body defining the bore.

In accordance with another example, the flange includes a first portion and a second portion. The first portion includes a potting cup and the face-seal groove.

In accordance with another example, the potting cup includes radiused corners.

In accordance with another example, further includes an electrical coupling. The electrical coupling extending through the passage of the flange and the bore of the body.

In accordance with another example, further including potting disposed within the potting cup of the flange and potting disposed within the bore of the body of the seal washer assembly.

In accordance with another example, the body of the seal washer assembly includes an internal surface defining the bore. The internal surface includes an anti-blowout feature.

In accordance with another example, the plug includes a first portion and a second portion. The first portion defining a potting cup.

In accordance with another example, further including potting disposed within the potting cup and potting disposed within the bore of the body adjacent the second portion of plug.

In accordance with another example, the plug includes an external groove. Further including a seal. The seal disposed within the external groove.

In accordance with another example, prior to positioning the electrical coupling through the passage of the flange of the seal washer assembly and the bore of the body of the seal washer assembly, coupling the flange and the body.

In accordance with a fifth example, a digital valve controller includes a main housing. The main housing includes an opening. The digital valve controller includes a terminal box. The terminal box including a bore. The bore of the terminal box is aligned with the opening of the main housing. The digital valve controller includes a seal washer assembly. The seal washer assembly is disposed within the bore and includes a seal washer and a pair of inserts. The seal washer includes a bore. The inserts being disposed within the bore of the seal washer and each includes a first portion, a second portion, and a groove. The grooves of the corresponding inserts mate to form a passage extending between the first portion of the inserts and the second portion of the inserts. The digital valve controller includes an electrical coupling. The electrical coupling extends through the passage formed by the grooves of the inserts.

In accordance with a sixth example, a seal washer assembly includes a seal washer and a pair of inserts. The seal washer includes a bore. The inserts being disposed within the bore of the seal washer and each including a first portion, a second portion, and a groove. The grooves of the corresponding inserts mate to form a passage extending between the first portion of the inserts and the second portion of the inserts.

In further accordance with the foregoing fifth and/or sixth examples, an apparatus may further include any one or more of the following:

In accordance with one example, further including potting disposed adjacent the first portion of the inserts and potting disposed adjacent the second portion of the inserts.

In accordance with another example, the potting disposed adjacent the first portion of the inserts provides a gas-seal rating and the potting disposed adjacent the second portion of the inserts provides an explosion-proof rating.

In accordance with another example, the potting is disposed within the bore of the seal washer adjacent the first portion of the inserts.

In accordance with another example, the potting disposed adjacent the first portion of the inserts is positioned between the first portion of the inserts and the seal washer.

In accordance with another example, the seal washer includes an external groove. Further including a seal. The seal being disposed within the external groove.

In accordance with another example, the bore of the terminal box includes an internal surface. The seal sealing engages the internal surface of the bore of the terminal box.

In accordance with another example, the seal washer includes an internal step. Each first portion of the inserts includes a flange. The flange engages the internal step of the seal washer.

In accordance with another example, the internal step faces the main housing.

In accordance with another example, the electrical coupling is a printed wiring board (PWB).

In accordance with another example, the passage between the first portion of the inserts and the second portion of the inserts has an oval cross-section.

In accordance with another example, the groove of each of the inserts has radiused corners.

In accordance with another example, the electrical coupling has radiused edges.

In accordance with another example, the inserts have a semi-circular cross-section and the groove has an oval cross-section.

In accordance with another example, further including a hollow connector body having a bore. The seal washer and the inserts being disposed within the bore of the hollow connector body.

In accordance with another example, further including an electrical coupling. The electrical coupling extending through the passage formed by the grooves of the inserts.

DETAILED DESCRIPTION

Although the following text discloses a detailed description of example methods, apparatus and/or articles of manufacture, it should be understood that the legal scope of the property right is defined by the words of the claims. Accordingly, the following detailed description is to be construed as examples only and does not describe every possible example, as describing every possible example would be impractical, if not impossible. Numerous alternative examples could be implemented, using either current technology or technology developed after the filing date of this patent. It is envisioned that such alternative examples would still fall within the scope of the claims.

Figure 1:
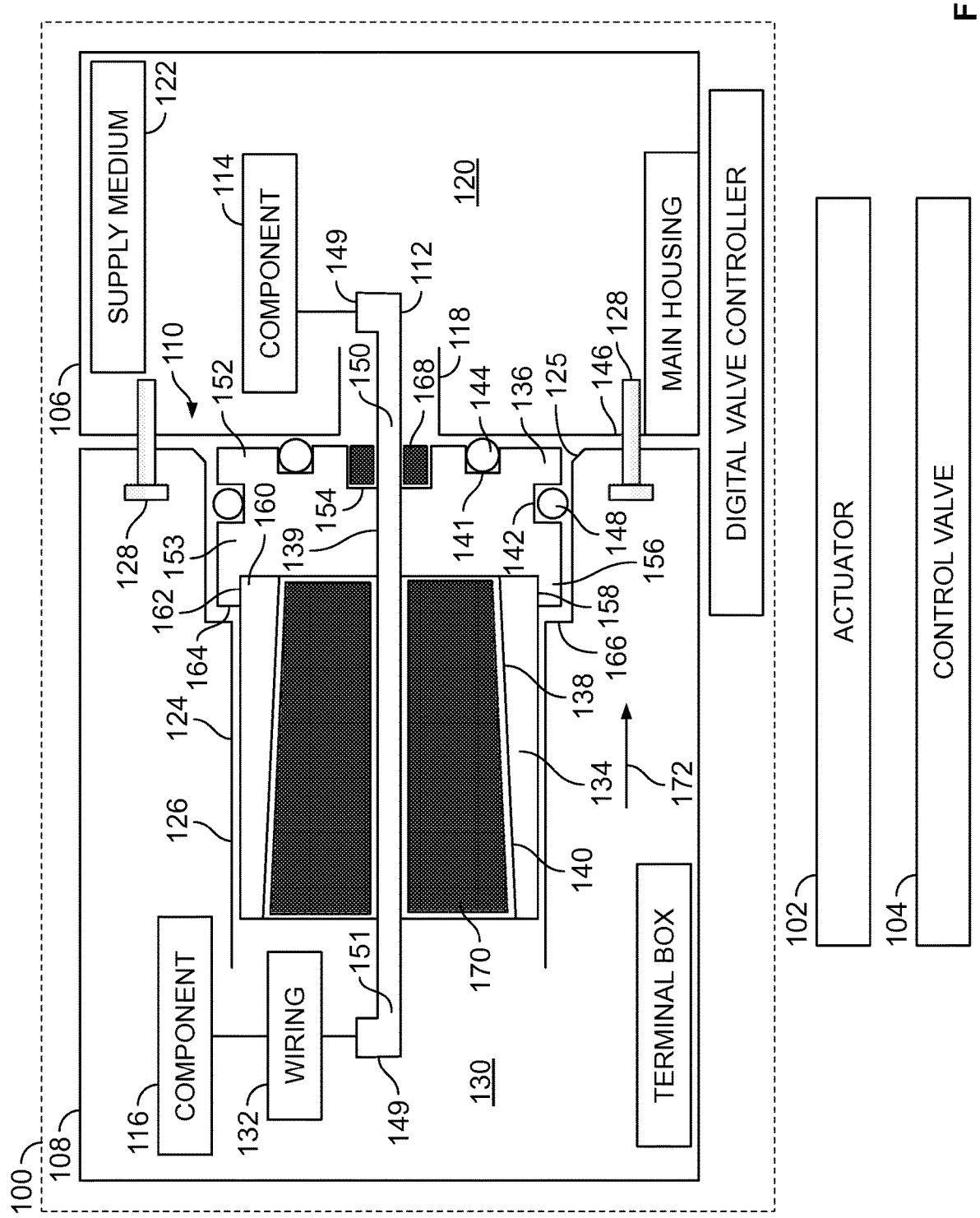
FIG. 1 is a schematic illustration of an example digital valve controller assembled in accordance with the disclosure.

Referring now to the drawings, FIG. 1 is a schematic illustration of an example digital valve controller 100 assembled in accordance with the teachings of the disclosure. In accordance with the disclosed example, the digital valve controller 100 is attached to an actuator 102 and is used to control the position of a control valve 104.

The digital valve controller 100 includes a main housing 106, a terminal box 108, and a seal washer assembly 110. The seal washer assembly 110 acts as a conduit between the main housing 106 and the terminal box 108 and is used to allow communication, via an electrical coupling 112, between a component 114 associated with the main housing 106 and a component 116 associated with the terminal box 108. In one example, the component 114 of the main housing 106 may be a sensor disposed within the main housing 106 and the component 116 of the terminal box 108 may be a processor. However, the components 114, 116 may be different depending on the application. In the example shown, the component 114 is disposed within the main housing 106 and the component 116 is disposed within the terminal box 108. Alternatively, the components 114, 116 may be reversed, or one or more of the components 114, 116 may be disposed outside of the main housing 106 or the terminal box 108.

The main housing 106 includes an opening 118 and the main housing 106 defines a chamber 120. The chamber 120 is adapted to receive a supply medium 122 such as pressurized air or a combustible and/or flammable gas, such as natural gas.

The terminal box 108 includes an internal surface 124 having a chamfer 125 and the terminal box 108 defines a bore 126. In the example shown, the bore 126 of the terminal box 108 is aligned with the opening 118 of the main housing 106 and is coupled thereto via fasteners 128. The terminal box 108 also defines a chamber 130 that, in the example shown, houses the component 116. The chamber 130 of the terminal box 108 may also house wiring 132 coupled to the component 116.

The seal washer assembly 110 is disposed, at least partially, in the bore 126 of the terminal box 108 and the seal washer assembly 110 includes a body 134 and a flange 136. The body 134 may comprise aluminum or another metal and the flange 136 may comprise plastic, or a similar material. The aluminum may comprise 6061-aluminum alloy and the plastic may comprise polyphenylene sulfide (PPS) or Ryton®, 40% glass-filled. However, either the body 134 or the flange 136 may be made of one or more different materials.

The body 134 of the seal washer assembly 110 is coupled to the flange 136 and the body 134 includes an internal surface 138 defining a bore 140. In the example shown, the internal surface 138 inwardly tapers inwardly, toward the flange 136. The internal surface 138 may additionally or alternatively include one or more steps, ribs, or protrusions. Any of the taper, the step, the rib, or the protrusion may provide anti-blow out functionality when potting is received within the bore 140, as further described below.

The flange 136 of the seal washer assembly 110 includes a passage 139, a face-seal groove 141, and an exterior-seal groove 142. The exterior-seal groove 142 may be a radial or annular groove extending around an outer surface of the flange 136. A face seal 144, such as an o-ring, is disposed within the face-seal groove 141 and is adapted to sealing engage a front surface 146 of the main housing 106. An exterior seal 148, such as an o-ring, is disposed within the exterior-seal groove 142 and is adapted to sealingly engage the internal surface 124 of the terminal box 108. In an example, the exterior seal 148 provides back-up or redundant sealing functionality to the face seal 144 and may deter egress into the terminal box 108 from outside/environmental conditions.

The electrical coupling 112 extends through the passage 139 of the flange 136 and the bore 140 of the body 134. An interaction between the flange 136 and the electrical coupling 112 may support the electrical coupling 112 within the passage 139 and, more generally, relative to the seal washer assembly 110. The electrical coupling 112 may comprise a printed wiring board (PWB). The electrical coupling 112 may comprise ISOLA 370 HR. The electrical coupling 112 may have a thickness of approximately 0.062 inches and may have a width of approximately 0.50 inches. However, the electrical coupling 112 may be formed with other dimensions.

In the example shown, connectors 149 are carried adjacent ends of the electrical coupling 112. The connectors 149 may be associated with a 4-wire version of the electrical coupling 112 or a 6-wire version of the electrical coupling 112. Wires of the wiring 132 may be attached to the connectors 149 of the electrical coupling 112 and the component 116 of the terminal box 108 to allow communication therebetween. Thus, the connectors 149 are conductors. In the example shown, after the electrical coupling 112 is passed through the passage 139 and the bore 140 of the body 134, the connectors 149 may be coupled to a first portion 150 of the electrical coupling 112 and a second portion 151 of the electrical coupling 112. Thus, the electrical coupling 112 may be sized to pass through the flange 136 without the connectors 149 attached. In the example shown, the first portion 150 of the electrical coupling 112 extends from the flange 136 of the seal washer assembly 110 and the second portion 151 of the electrical coupling 112 extends from the bore 140 of the body 134 of the seal washer assembly 110.

The flange 136 also includes a first portion 152 and a second portion 153. In the example shown, the first portion 152 includes a potting cup 154 and the face-seal groove 141 and the second portion 153 includes a rearward projection/collar 156. An annular space 158 is formed by the collar 156. An end portion 160 of the body 134 is received within the annular space 158 of the flange 136. An interaction between the end portion 160 of the body 134 and an inward surface 162 of the collar 156 forms a press-fit connection. The press-fit connection couples the body 134 and the flange 136 together. Thus, in the example shown, the collar 156 of the flange 136 receives the body 134 of the seal washer assembly 110 to form the press-fit connection. However, the body 134 and the flange 136 may be coupled in different ways including, for example, adhesive, a fastener (e.g., a bolt), or by over-molding the components. As an alternative, the body 134 and the flange 136 may be formed as a single part. In yet other examples, the inward surface 162 and the collar 156 could be reversed.

In the example shown, an exterior step 164 is formed between the collar 156 of the flange 136 and the body 134 of the seal washer assembly 110. The internal surface 124 forming the bore 126 of the terminal box 108 includes an internal step 166. The exterior step 164 of the seal washer assembly 110 is adapted to engage the internal step 166 of the terminal box 108. Specifically, the seal washer assembly 110 is positioned to allow pressure within the main housing 106 to urge the exterior step 164 of the seal washer assembly 110 into engagement with the internal step 166 of the terminal box 108.

Potting 168 is disposed within the potting cup 154 and potting 170 is disposed within the bore 140 of the body 134 of the seal washer assembly 110. The potting 168, 170 may enable the seal washer assembly 110 to be hermetically sealed. In the example shown, the inward taper of the internal surface 138 of the body 134 may be adapted to provide an anti-blowout feature that deters the potting 170 from being urged out of the body 134 in a direction generally indicated by arrow 172. Thus, the inward taper of the internal surface 138 may provide a wedge effect that retains the potting 170 within the seal washer assembly 110. However, other anti-blowout features may be used (see, for example, FIG. 5). In an example, the potting 168 may comprise MasterBond® Supreme 10AOHT and the potting 170 may comprise Stycast® 2850 FT-FR/Cat 9 or Cat 11, or Hardman® 42174/52174.

Figure 2:
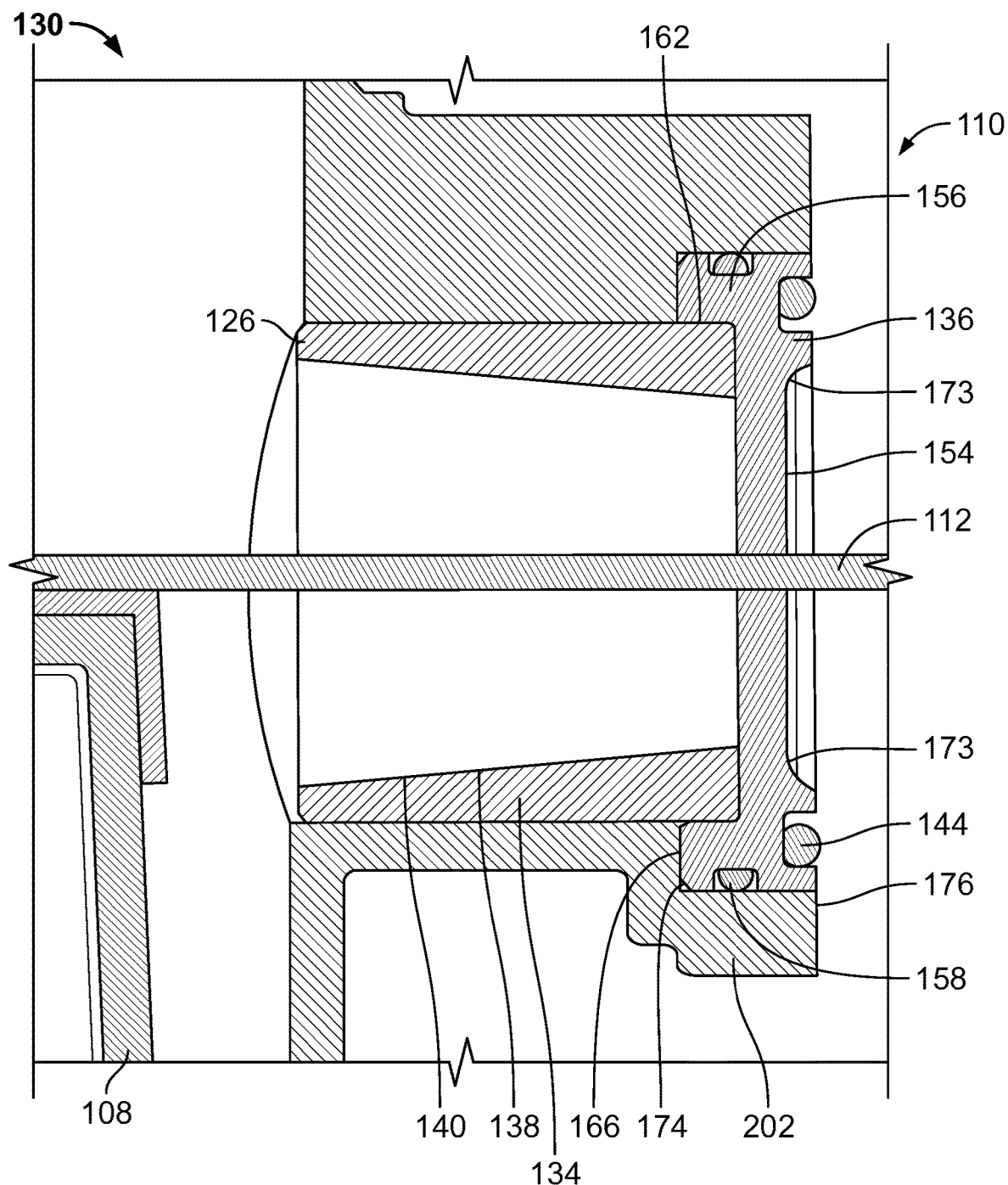
FIG. 2 is a cross-sectional view of a seal washer assembly disposed within the bore of the terminal box of the digital valve controller of FIG. 1.

FIG. 2 illustrates a cross-sectional view of the seal washer assembly 110 disposed within the bore 126 of the terminal box 108 in accordance with another embodiment. In contrast to the example illustrated in FIG. 1, the terminal box 108 of FIG. 2 includes a collar 202 that forms the bore 126 and the main housing 106 of the digital valve controller 100 is not illustrated. The collar 202 may be integrally formed with the terminal box 108 or may be a separate component coupled (e.g., bolted) to the terminal box 108. Additionally, in contrast to the example shown in FIG. 1, the pottings 168 and 170 are not illustrated.

In this example, the potting cup 154 has radiused corners 173. Using the radiused corners 173 or otherwise curved surfaces instead of sharp corners may reduce the likelihood that the potting 168 detaches and/or cracks when the seal washer assembly 110 is exposed to one or more thermal cycles, for example. Additionally, in the example shown, the collar 156 of the flange 136 includes a chamfered portion 174. An interaction between the chamfered portion 174 and an internal edge 176 of the bore 126 may reduce the difficulty of inserting the seal washer assembly 110 into the bore 126 of the terminal box 108.

Figure 3:
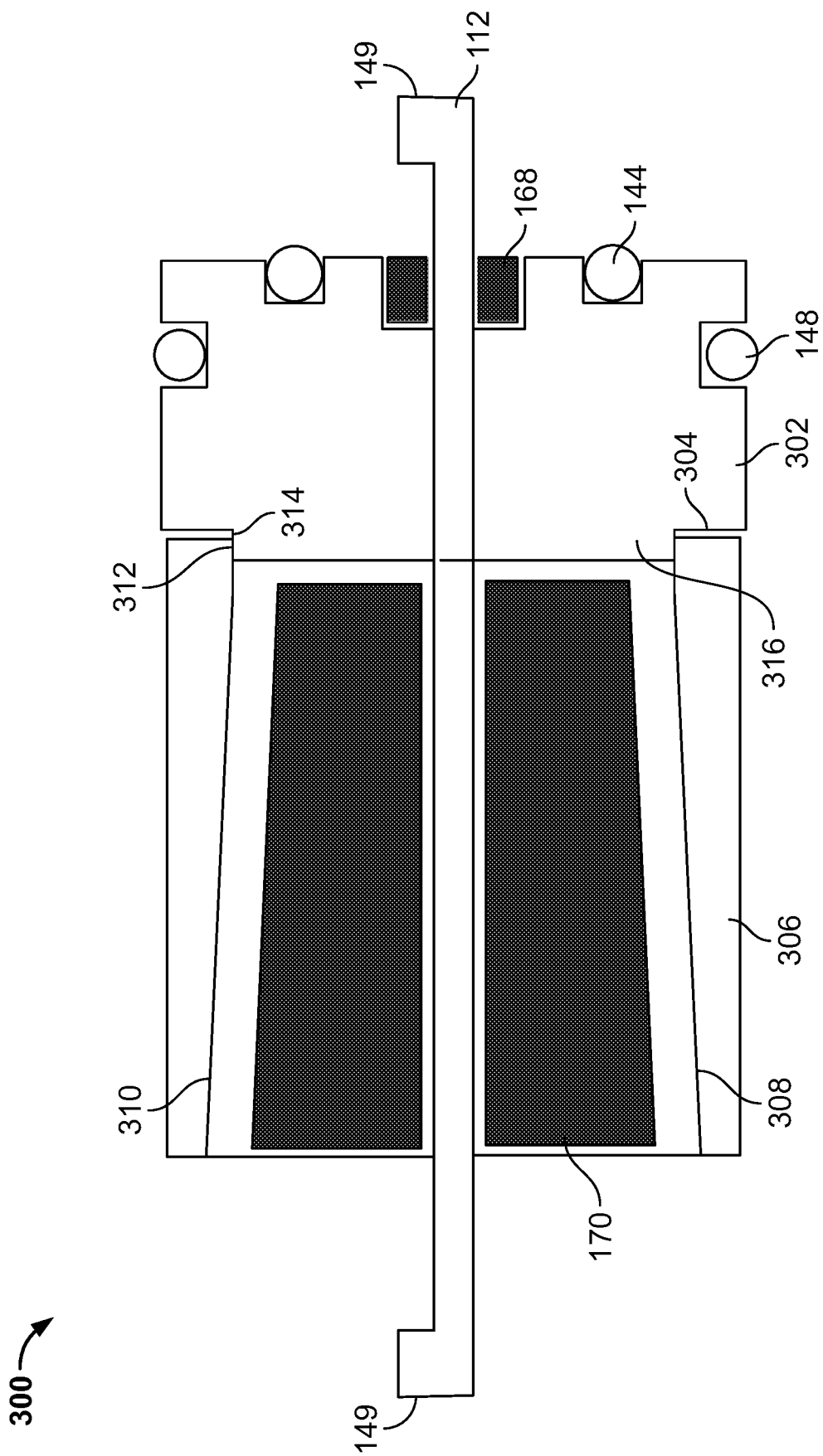
FIG. 3 is a cross-sectional view of another embodiment of a seal washer assembly.

FIG. 3 illustrates a cross-sectional view of another embodiment of a seal washer assembly 300. The seal washer assembly 300 is similar to the seal washer assembly 110 of FIG. 1. However, in contrast, the seal washer assembly 300 includes a flange 302 having an external step 304. The seal washer assembly 300 also includes a body 306 having an internal surface 308. The internal surface 308 includes a tapered portion 310 and a flat or annular portion 312. The tapered portion 310 is adapted as an anti-blowout feature. The flat portion 312 is adapted to correspond to a surface 314 forming the step 304 of the flange 302. In the example shown, the body 306 of the seal washer assembly 300 is received within the step 304 to form a press-fit connection. Thus, the body 306 of the seal washer assembly 300 surrounds a portion 316 of the flange 302.

Figure 4:
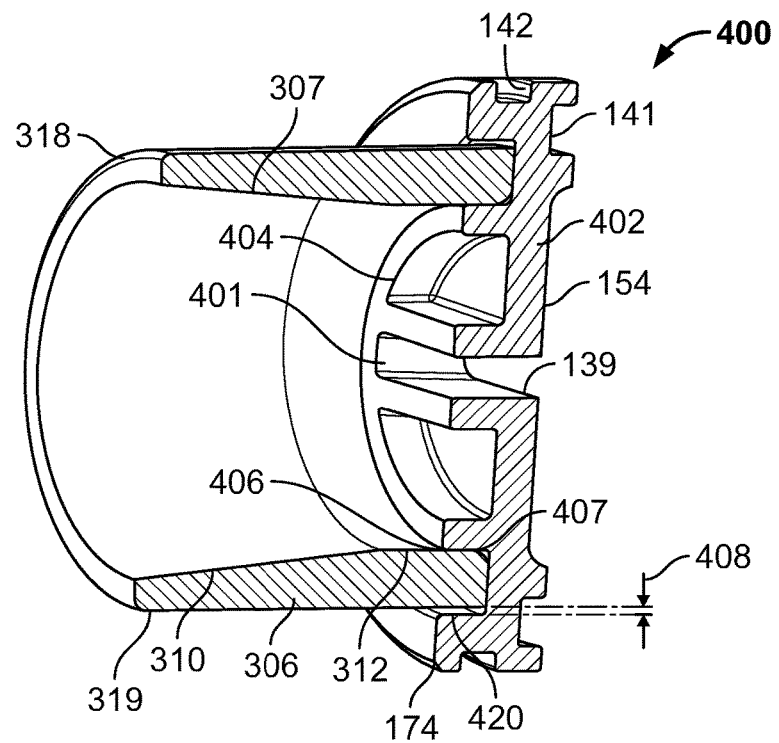
FIG. 4 is a perspective cross-sectional view of yet another embodiment of a seal washer assembly.

FIG. 4 illustrates a cross-sectional view of another embodiment of a seal washer assembly 400. The seal washer assembly 400 is similar to the seal washer assembly 300 of FIG. 3. However, the passage 139 of the flange 302 has radiused ends 401. Thus, the passage 139 has an oval cross-section. The radiused ends 401 of the passage 139 may reduce the likelihood that the potting 168 detaches and/or cracks when the seal washer assembly 110 is exposed to one or more thermal cycles, for example. Alternatively, the passage 139 may have a different cross-section such as, for example, a rectangular cross-section.

In contrast to the seal washer assembly 300 of FIG. 3, the seal washer assembly 400 includes a first portion 402 and a second portion 404, where the first portion 402 includes the face-seal groove 141 and the second portion 404 includes a coupling groove 406. In the example shown, the body 306 is received within the coupling groove 406 to form a press-fit connection. Specifically, a press-fit connection is formed between the internal surface 308 of the body 306 and the flange 302. The coupling groove 406 includes an outward facing surface 407 that is adapted to correspond to the flat portion 312 of the internal surface 308 of the body 306 of the seal washer assembly 400.

The body 306 of the seal washer assembly 400 also includes a chamfered end portion 318 and an outward facing surface 319. The chamfered end portion 318 may facilitate inserting the seal washer assembly 400 within the bore 126 of the terminal box 108, for example. The outward facing surface 319 may be coaxial and parallel to a central—longitudinal axis of the body 306 of the seal washer assembly 400.

The coupling groove 406 is also formed by an inward facing surface 420. In the example shown, a gap 408 is provided between the outward facing surface 319 of the body 306 of the seal washer assembly 400 and the inward facing surface 320 forming the coupling groove 406. The gap 408 may allow for the press-fit connection to be formed between the body 306 and the flange 302. In an alternative example, the outer diameter of the body 306 of the seal washer assembly 400 may be sized such that the outward facing surface 319 of the body 306 forms a press-fit connection with the inward facing surface 320 forming the coupling groove 406. In such examples, a gap may be provided within the flat portion 312 of the internal surface 308 of the body 306 and the outward facing surface 407 of the coupling groove 406. Alternatively, the flat portion 312 may be removed. While the body 306 and the flange 302 are disclosed being coupled using an interference fit, the body and the flange 302 may be coupled in different ways such using adhesive.

Figure 5:
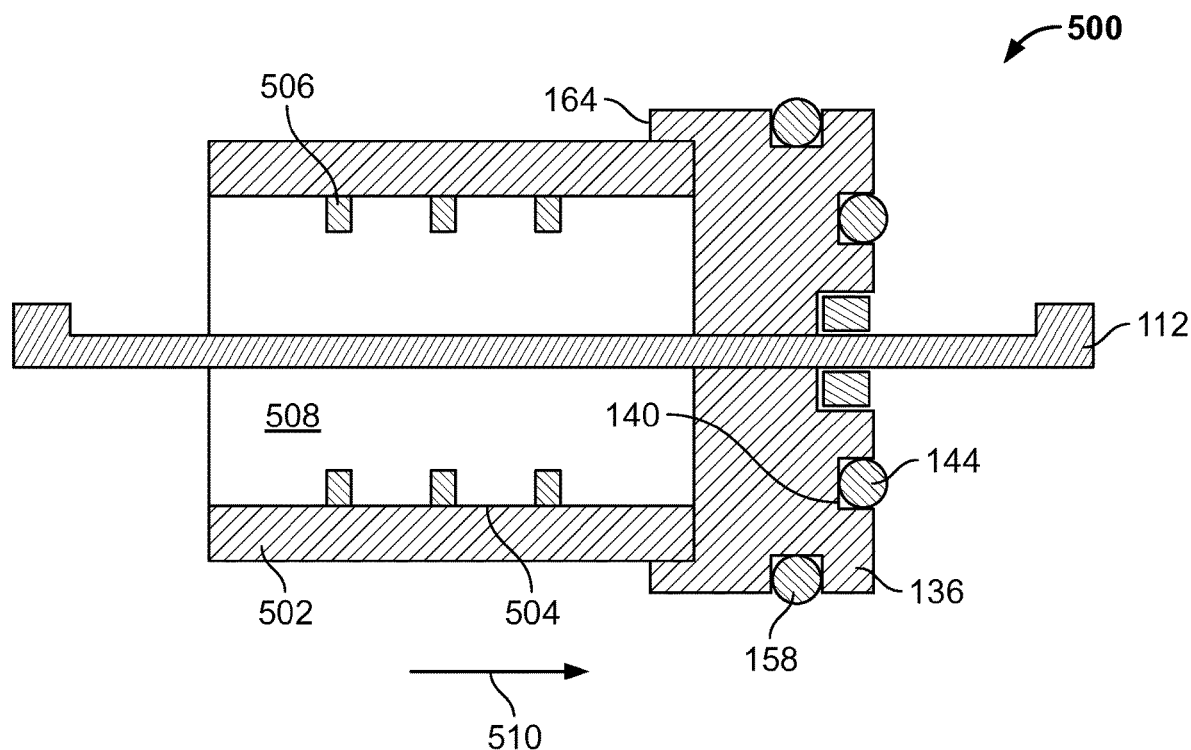
FIG. 5 is a cross-sectional view of yet another embodiment of a seal washer assembly.

FIG. 5 illustrates a cross-sectional view of another embodiment of a seal washer assembly 500. The seal washer assembly 500 is similar to the seal washer assembly 110 of FIG. 1. However, in contrast, the seal washer assembly 500 includes a body 502 having an internal surface 504 defining having a plurality of inwardly extending protrusions 506. The internal surface 504 of the body 502 defines a bore 508. The bore 508 is adapted to receive potting. The protrusions 506 may be adapted to provide an anti-blowout feature that deters the potting from exiting the seal washer assembly 500 in a direction generally indicated by arrow 510. The protrusions 506 are formed as ribs having a rectangular cross-section. However, the protrusions 506 may have any other cross-section and/or may be radially spaced.

Figure 6:
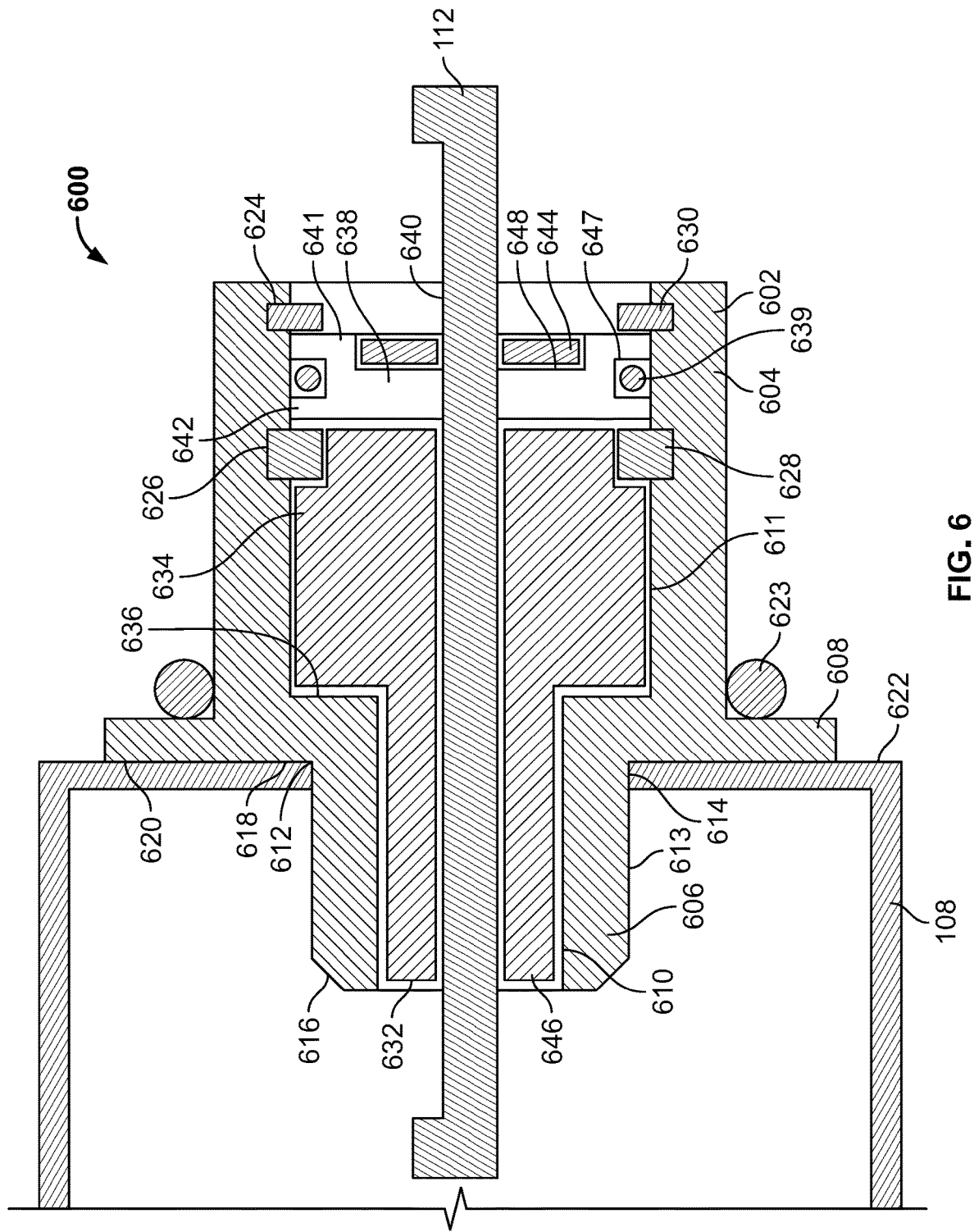
FIG. 6 is a cross-sectional view of yet another embodiment of a seal washer assembly.

FIG. 6 illustrates a cross-sectional view of another embodiment of a seal washer assembly 600. In contrast to some of the other examples disclosed herein, the seal washer assembly 600 of FIG. 6 may be adapted to form a spigot joint with the terminal box 108. Thus, in an example, the seal washer assembly 600 may have a bi-direction explosion proof rating.

The seal washer assembly 600 includes a body 602 having a first portion 604, a second portion 606, and a flange 608, and defines a bore 610. The bore 610 is defined by an internal surface 611 of the body 602.

The first portion 604 of the body 602 extends through an opening 612 of the terminal box 108. A press-fit connection may be formed between an outer surface 613 of the first portion 604 of the body 602 and an inward-facing surface 614 that forms the opening 612 of the terminal box 108. In the example shown, a diameter of the first portion 604 of the body 602 is less than a diameter of the second portion 606 of the body 602. Alternatively, a diameter of the first and second portions 604, 606 of the body 602 may be similar or the same.

The first portion 604 includes a chamfered-end portion 616. The chamfered-end portion 616 may reduce the difficulty in inserting the body 602 of the seal washer assembly 600 within the opening 612 of the terminal box 108. Alternatively, the chamfered end portion 616 may be excluded or may be rounded.

The flange 608 of the body 602 is positioned between the first portion 604 of the body 602 and the second portion 606 of the body 602. A step 618 is formed between a surface 620 of the flange 608 and an exterior-facing surface 622 of the terminal box 108. The surface 620 of the flange 608 is adapted to engage the exterior-facing surface 622 of the terminal box 108. A seal 623 is positioned around the first portion 604 of the body 602 adjacent the flange 608. The seal 623 may an environmental seal that sealingly engages the main housing 106 of the digital valve controller 100, for example. The seal 623 may deter the egress into the main housing 106 when the terminal box 108 is coupled to the main housing 106.

The bore 610 includes a pair of longitudinally spaced grooves 624, 626. Fasteners 628, 630 are received within corresponding ones of the grooves 624, 626. The fasteners 628, 630 may be snap rings.

The bore 610 also includes a first portion 632 and a second portion 634. The second portion 634 of the bore 610 defines the grooves 624, 626. In the example shown, the first portion 632 of the bore 610 has a diameter less than the second portion 634 of the bore 610. A step 636 is formed between the internal surface 611 of the body 602 between the first portion 632 of the bore 610 and the second portion 634 of the bore 610. Thus, the bore 610 has a T-shaped cross section.

In the example shown, a plug 638 is disposed within the bore 610 of the body 602 between the fasteners 628, 630. The plug 638 includes a passage 640. The plug 638 also includes a first portion 641 and a second portion 642. The passage 640 extends between the first and second portions 641, 642 of the plug 638. The electrical coupling 112 extends through the passage 640 of the plug 638 and the bore 610 of the body 602.

Potting 644 is disposed adjacent the first portion 641 of the plug 638 and potting 646 is disposed adjacent the second portion 642 of the plug 638. In the illustrated example, the first portion 641 of the plug 638 defines a potting cup 648. The potting 644 is disposed within the potting cup 648 and the potting 646 is disposed within the bore 610 of the body 602. In an example, the potting 644 comprises Master-Bond® Supreme 10AOHT and may be adapted to adhere to the plug 638 and the potting 646 comprises Stycast® 2850 FT-FR/Cat 9 or Cat 11, or Hardman® 42174/52174.

The plug 638 includes an external groove 647. A seal 639 is disposed within the external groove 647. The seal 639 may be an O-ring. The seal 639 is adapted to sealingly engage the internal surface 611 defining the bore 610 of the body 602.

Figure 7:
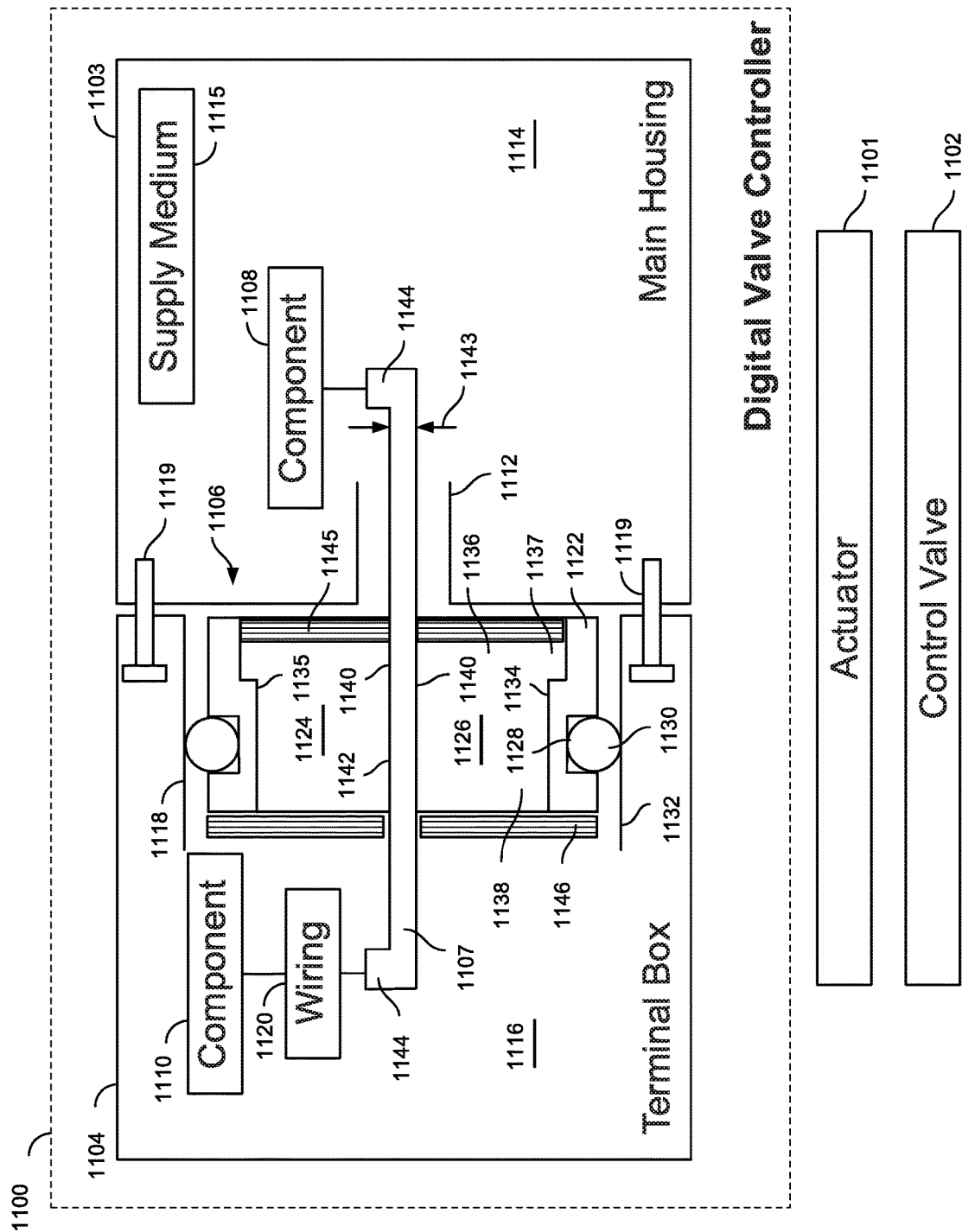
FIG. 7 is a schematic illustration of another embodiment of a digital valve controller assembled in accordance with the disclosure.

Turning now to FIG. 7 is a schematic illustration of another embodiment of a digital valve controller 1100. The digital valve controller 1100 is attached to an actuator 1101 and is used to control the position of a control valve 1102.

The digital valve controller 1100 includes a main housing 1103, a terminal box 1104, and a seal washer assembly 1106. The seal washer assembly 1106 acts as a conduit between the main housing 1103 and the terminal box 1104 and is used to allow communication via an electrical coupling 1107 between a component 1108 associated with the main housing 1103 and a component 1110 associated with the terminal box 1104. The component 1081 of the main housing 1103 may comprise a sensor and the component 1110 of the terminal box 1104 may comprise a processor. However, the components 1108, 1110 may be different depending on the application. In the example shown, the component 1108 is disposed within the main housing 1103 and the component 1110 is disposed within the terminal box 1104. Alternatively, one or more of the components 1108, 1110 may be disposed outside of the main housing 1103 or the terminal box 1104.

The main housing 1103 includes an opening 1112 and defines a chamber 1114. The chamber 1114 is adapted to receive a supply medium 1115 such as pressurized air or an explosive or combustible gas, such as natural gas.

The terminal box 1104 includes a bore 1118. In the example shown, the bore 1118 of the terminal box 1104 is aligned with the opening 1112 of the main housing 1103 and is coupled relative thereto via fasteners 1119. The terminal box 1104 also defines a chamber 1116 that, in the example shown, houses the component 1110. The chamber 1116 may also house wiring 1120 coupled to the component 1110.

The seal washer assembly 1106 is disposed in the bore 1118 of the terminal box 1104. In the example shown, the seal washer assembly 1106 includes a seal washer 1122 and a pair of inserts 1124, 1126. The seal washer 1122 or either of the inserts 1124, 1126 may comprise Ryton® R-4-200NA. However, other materials may be used.

The seal washer 1122 includes an external groove 1128 in which a seal 1130 is disposed. The seal 1130 may be an O-ring. The seal 1130 is adapted to sealingly engage an internal surface 1132 of the terminal box 1104 that defines the bore 1118. The seal washer 1122 also includes a bore 1134 in which the inserts 1124, 1126 are disposed. The seal washer 1122 may include an internal step 1135 that faces the main housing 1103. A diameter of the bore 1134 may be approximately 0.838 inches. However, the bore 1134 may have any other diameter.

In the example shown, the inserts 1124, 1126 are substantially similar or the same and each includes a first portion 1136, a second portion 1138, and a groove 1140. The first portion 1136 includes a flange 1137 engaging the internal step 1135 of the seal washer 1122. The seal washer assembly 1106 is positioned to allow pressure within the chamber 1114 of the main housing 1103 to urge the flange 1137 of the inserts 1124, 1126 into engagement with the internal step 1135 of the seal washer 1122. The grooves 1140 of the inserts 1124, 1126 face one another and mate to form a through passage 1142. The passage 1142 extends between the first portion 1136 of the inserts 1124, 1126 and the second portion 1138 of the inserts 1124, 1126.

The electrical coupling 1107 extends through the passage 1142 formed by the grooves 1140 of the inserts 1124, 1126. An interaction between the inserts 1124, 1126 and the electrical coupling 1107 may support the electrical coupling 1107 within the passage 1142. The electrical coupling 1107 may comprise a printed wiring board (PWB). The electrical coupling 1107 may comprise ISOLA 370 HR. The electrical coupling 1107 may have a thickness 1143 of approximately 0.062 inches and may have a width of approximately 0.50 inches. However, the electrical coupling 1107 may be formed with other dimensions. In the example shown, connectors 1144 are carried adjacent ends of the electrical coupling 1107. In an example, wires of the wiring 1120 may be attached to the connectors 1144 of the electrical coupling 1107 to facilitate communication with the component 1110.

Potting 1145 is disposed adjacent the first portion 1136 of the inserts 1124, 1126 and potting 1146 is disposed adjacent the second portion 1138 of the inserts 1124, 1126. The potting 1145 and/or 1146 may hermetically seal the seal washer assembly 1106.

In the example shown, the potting 1145 adjacent the first portion 1136 of the inserts 1124, 1126 is disposed within the bore 1134 of the seal washer 1122. The potting 1145 adjacent the first portion 1136 of the inserts 1124, 1126 may provide the seal washer assembly 1106 or, more specifically, the main housing 1103 of the digital valve controller 1100 with a gas-seal rating and may deter the supply medium 1115 from passing from the main housing 1103 to the terminal box 1104 via the bore 1118 of the terminal box 1104. As an example, the potting 1145 may enable the seal washer assembly 1106 to be bubble free at room temperature with the chamber 1114 of the main housing 1103 being pressurized to approximately 300 pounds per square inch gauge (psig). The potting 1145 may comprise Master Bond® Supreme 10HTFL. However, any other potting may be used.

The potting 1146 adjacent the second portion 1138 of the inserts 1124, 1126 may provide the seal washer assembly 1106 and, specifically, the terminal box 1104 of the digital valve controller 1100 with an explosion-proof rating. The potting 1146 may comprise Hardman® 42174/52174. However, any other potting may be used. Additionally, as an alternative to using the potting 1145, 1146 or glue, the seal washer assembly 1106 may be sealed using an over-molding process.

Figure 8:
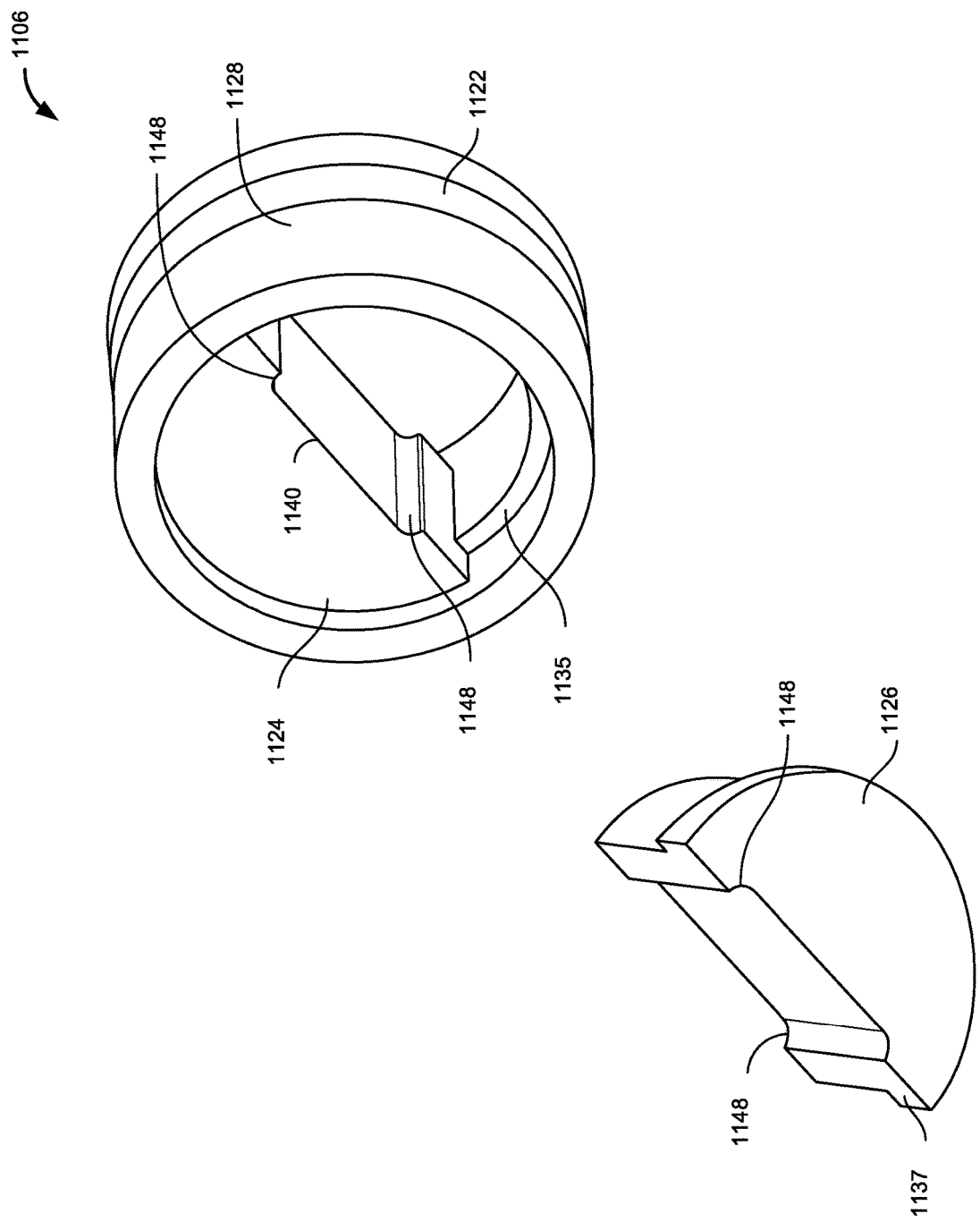
FIG. 8 is a partially expanded view of the seal washer assembly of FIG. 7 without the seal disposed within the external groove of the seal washer.

FIG. 8 illustrates a partially expanded view of the seal washer assembly 1106 of FIG. 7 without the seal 1130 disposed within the external groove 1128 of the seal washer 1122. In the example shown, the seal washer 1122 has a circular cross-section and the inserts 1124, 1126 have a semi-circular cross-section. Additionally, the grooves 1140 have radiused corners 1148. Using the radiused corners 1148 instead of sharp corners may reduce the likelihood that the potting 1145, 1146 detaches and/or cracks when the seal washer assembly 1106 is exposed to one or more thermal cycles, for example.

Figure 9:
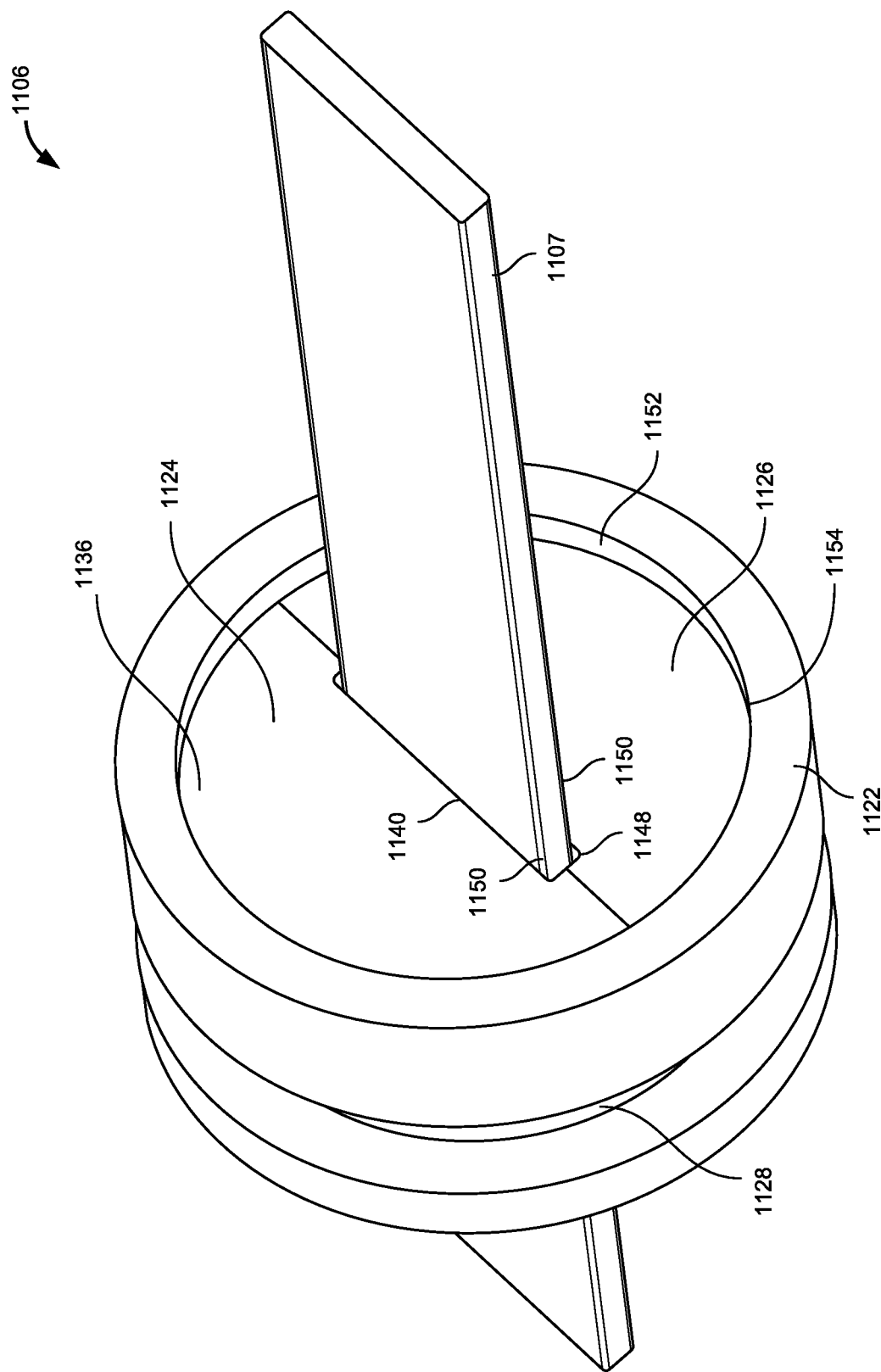
FIG. 9 is an isometric view of the seal washer assembly of FIG. 7 including an electrical coupling.

FIG. 9 illustrates an isometric view of the seal washer assembly 1106 of FIG. 7 including the electrical coupling 1107 extending through the inserts 1124, 1126. In the example shown, the mating grooves 1140 have an oval cross-section and edges 1150 of the electrical coupling 1107 are radiused. The radiused edges 1150 of the electrical coupling 1107 may correspond to the radiused corners 1148 of the inserts 1124, 1126. However, the mating grooves 1140 may alternatively have a different cross-section. For example, the mating grooves 1140 may form a rectangular cross-section. In such an example, the corners of the grooves 1140 may form approximately a 90° angle.

FIG. 9 also illustrates a space/potting cup 1152 defined between the first portion 1136 of the inserts 1124, 1126 and an internal edge 1154 of the seal washer 1122. The space 1152 is formed by the bore 1134 and is adapted to receive the potting 1145. A depth 1155 (the depth is most clearly shown in FIG. 10) of the space 1152 may be approximately 0.060 inches. However, the depth 1155 of the space 1152 may be any other distance.

Figure 10:
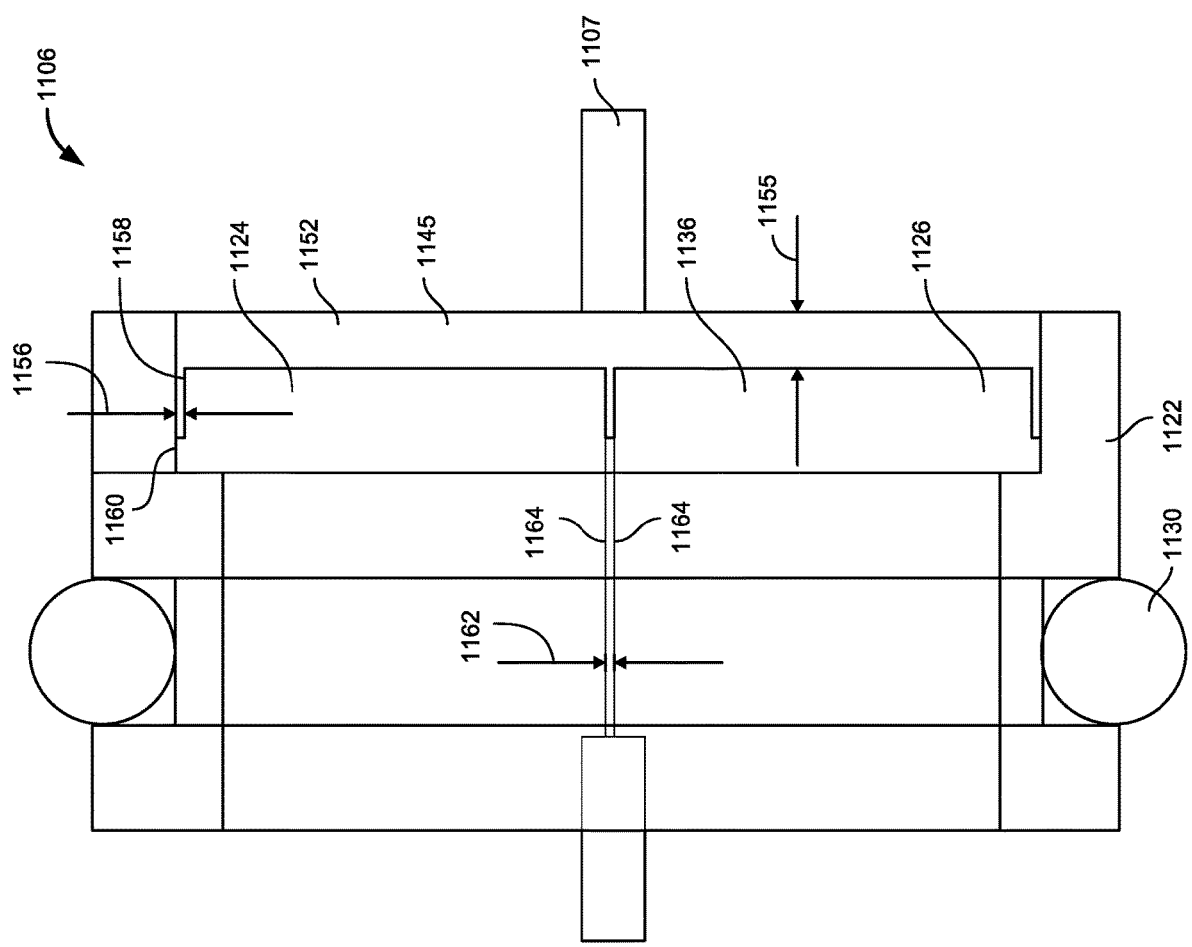
FIG. 10 is a partially transparent side view of the seal washer assembly of FIG. 7.

FIG. 10 illustrates a partially transparent side view of the seal washer assembly 1106 of FIG. 7. In the example shown, the potting 1145 adjacent the first portion 1136 of the inserts 1124, 1126 is positioned between the first portion 1136 of the inserts 1124 and the seal washer 1122. Specifically, an outer gap 1156 is provided between an outer surface 1158 of the inserts 1124, 1126 and an internal surface 1160 of the seal washer 1122. The outer gap 1156 may be approximately 0.005 inches. However, the outer gap 1156 may be a different distance. Additionally, in the example shown, an interior gap 1162 is provided between inner surfaces 1164 of the inserts 1124, 1126. The interior gap 1162 may be approximately 0.010 inches. However, the interior gap 1162 may be a different distance.

Figure 11:
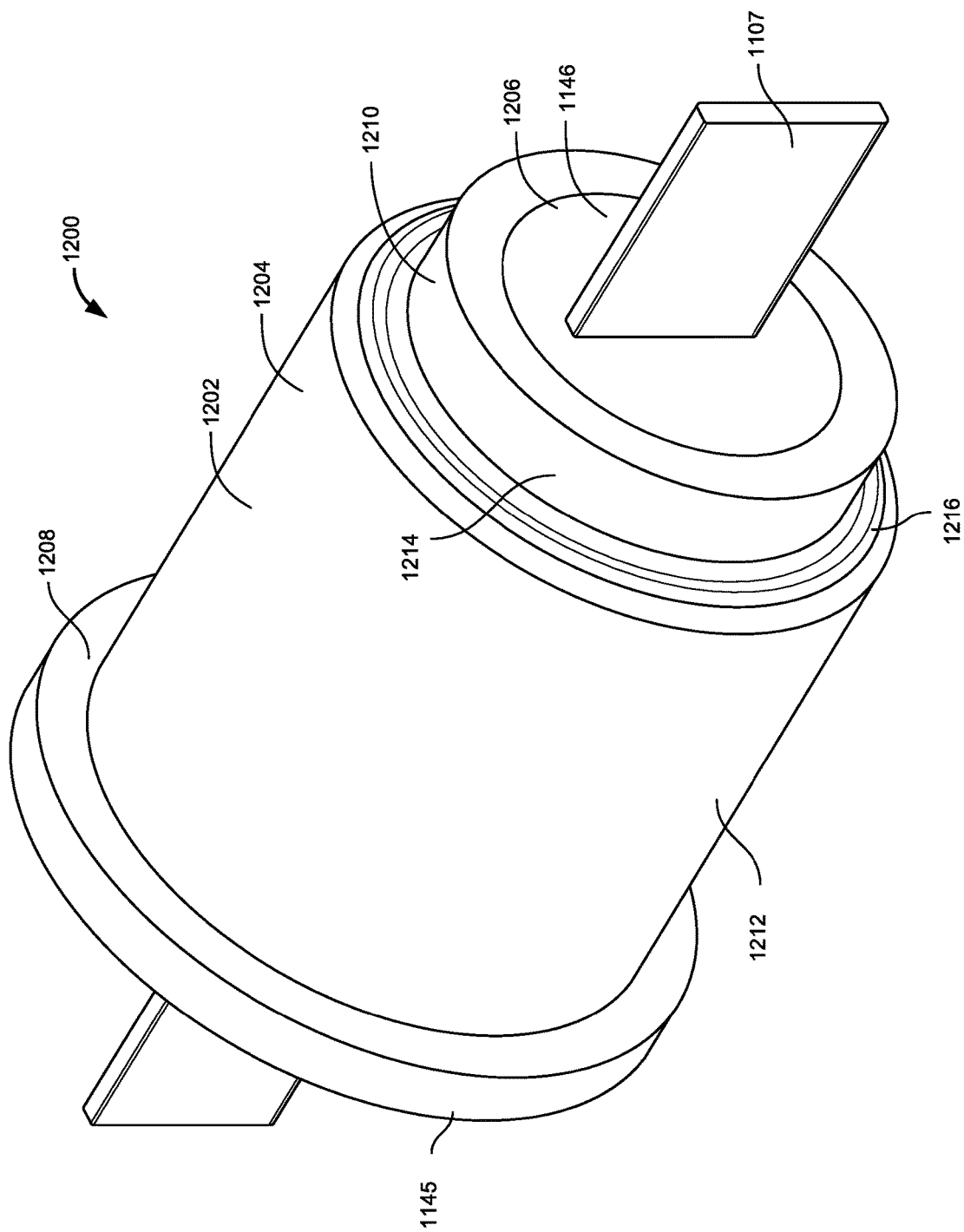
FIG. 11 is a perspective view of a connector assembly assembled in accordance with the disclosure.

FIG. 11 illustrates an example connector assembly 1200. The connector assembly 1200 may be positioned within the bore 1118 of the terminal box 1104. In such examples, the bore 1118 of the terminal box 1104 may be adapted to have a cross-section that corresponds to the cross-section of the connector assembly 1200.

In the example shown, the connector assembly 1200 includes a hollow connector body 1202 including an exterior surface 1204 and a bore 1206. The seal washer assembly 1106 of FIG. 7 may be disposed within the bore 1206 of the connector body 1202. The potting 1145, 1146 is received within the bore 1206 of the connector body 1202.

The connector body 1202 includes a flange 1208 and an exterior step 1210. The flange 1208 of the connector body 1202 may be adapted to be received within a corresponding portion of the bore 1118 of the terminal box 1104. The first portion 1136 of the inserts 1124, 1126 may face the flange 1208 of the connector body 1202. The exterior step 1210 is defined between a central portion 1212 of the connector body 1202 and an end portion 1214 of the connector body 1202.

A seal 1216 is disposed around the end portion 1214 of the connector body 1202 and adjacent the exterior step 1210. The seal 1216 may be adapted to sealingly engage a portion of the bore 1118 of the terminal box 1104.

Figure 12:
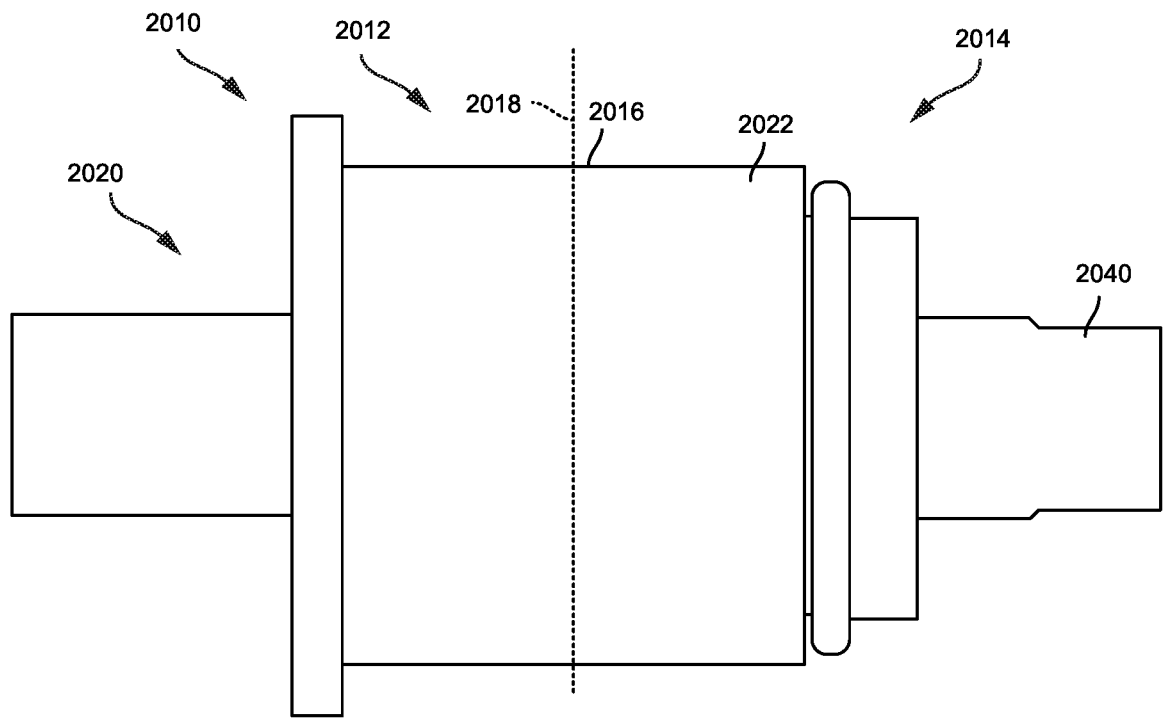
FIG. 12 is a top plan view of a printed wiring board connector assembly constructed in accordance with the teachings of the disclosure.
Figure 13:
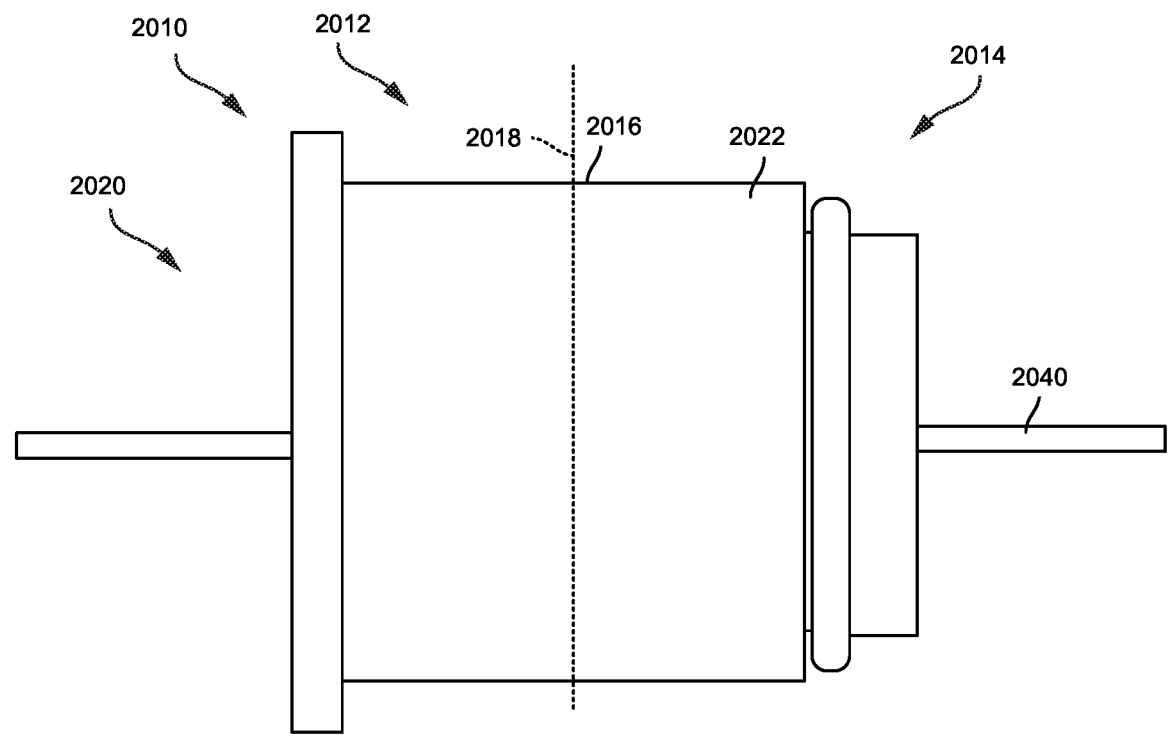
FIG. 13 is a side plan view of the printed wiring board connector assembly of FIG. 12.
Figure 14:
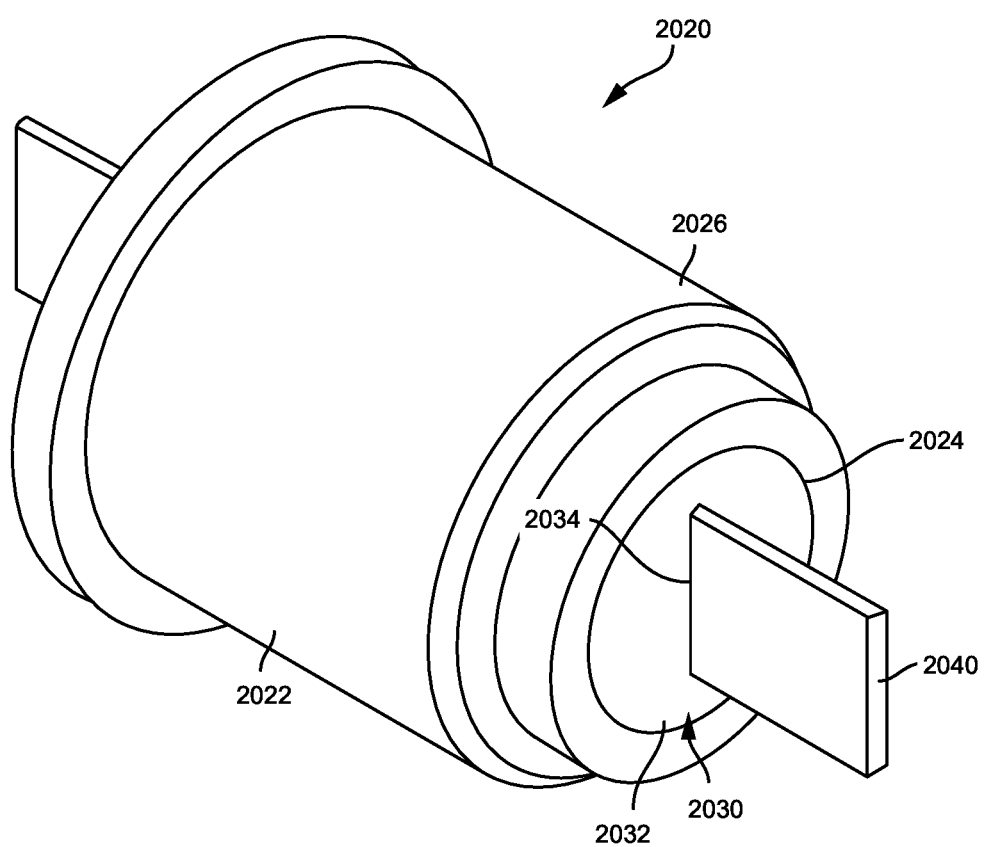
FIG. 14 is a perspective view of the printed wiring board connector assembly of FIG. 12.
Figure 15:
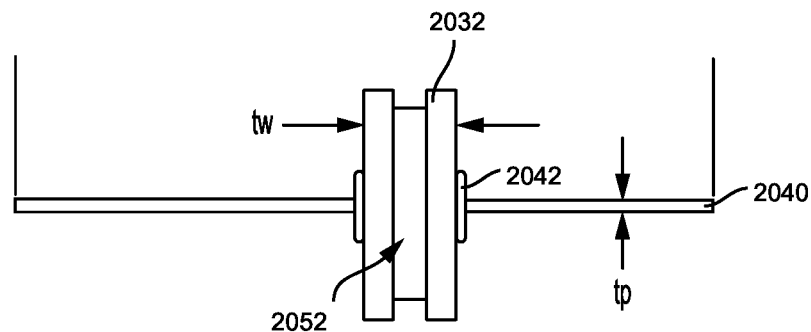
FIG. 15 is a side plan view of a washer assembly of the printed wiring board connector assembly of FIG. 12.
Figure 16:
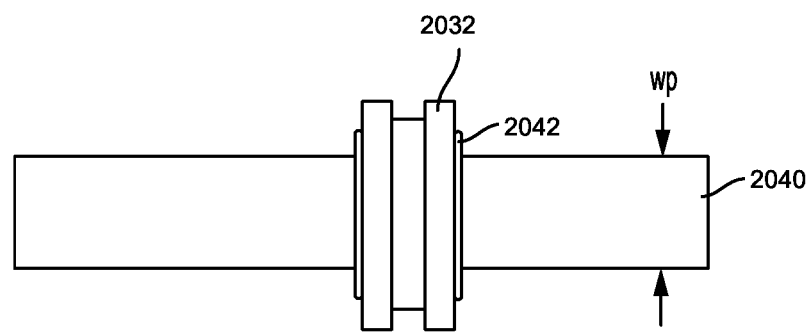
FIG. 16 is a top plan view of the washer assembly of FIG. 15.

Turning now to FIGS. 12-14, a conduit 2010 between a first chamber 2012 and a second chamber 2014 of an explosive gas process control system is illustrated. The conduit 2010 illustrated in FIGS. 12-14 may be used in any of the digital valve controllers 100, 1100 disclosed above. An opening 2016 is located in a wall 2018 between the first chamber 2012 and the second chamber 2014. In the illustrated embodiment, the first chamber 2012 and the second chamber 2014 are chambers located in an explosive gas process control system. At least one of the first chamber 2012 and the second chamber 2014 is pressurized with an explosive gas. An explosive gas is defined herein as any gas that is ignitable at its existing pressure and which burns after ignition.

A connector assembly 2020 links a control system sensor to a processor, as described above. The connector assembly 2020 includes a hollow connector body 2022 having an inner surface 2024 that defines an inner diameter and an outer surface diameter 2026 that defines an outer diameter. A seal washer 2030 includes a washer body 2032 and a central opening 2034 through the washer body 2032. The seal washer 2030 is disposed in the hollow connector body 2022. A multi-layer insulated printed wiring board (PWB) 2040 extends through the central opening 2034.

Turning now to FIGS. 15-20, an overmolded rubber insert 2042 is disposed between the PWB 2040 and the washer body 2032. The overmolded rubber insert 2042 seals the PWB 2040 against the washer body 2032 to prevent transmission of gases from one side of the washer body 2032 to another side of the washer body 2032, or from the first chamber 2012 to the second chamber 2014.

Figure 17:
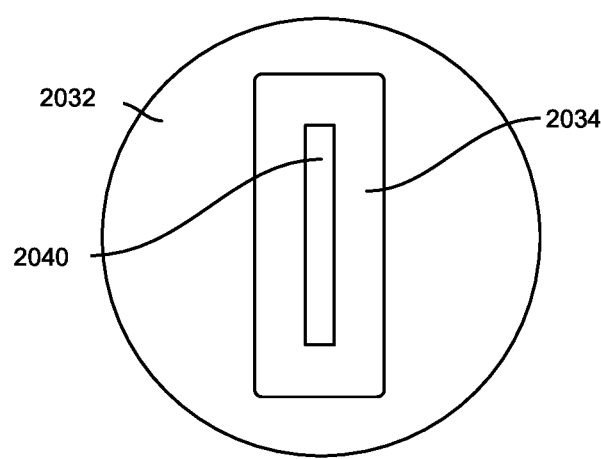
FIG. 17 is an end view of the washer assembly of FIG. 15.

As illustrated in FIG. 17, in one embodiment, the central opening 2034 may have a rectangular shape.

Figure 18:
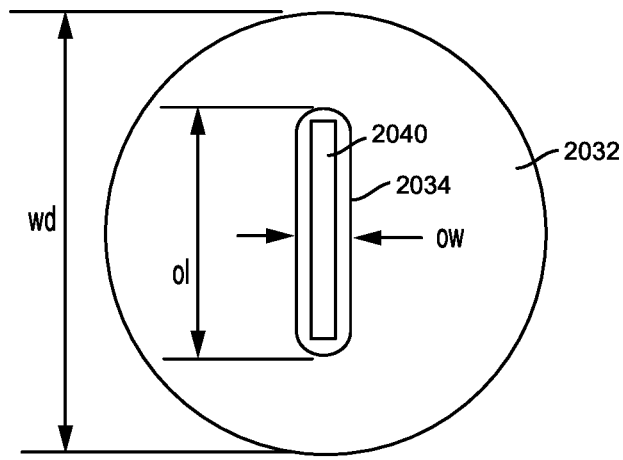
FIG. 18 is an end view of the washer assembly of FIG. 15 with rubber over-molding removed.
Figure 19:
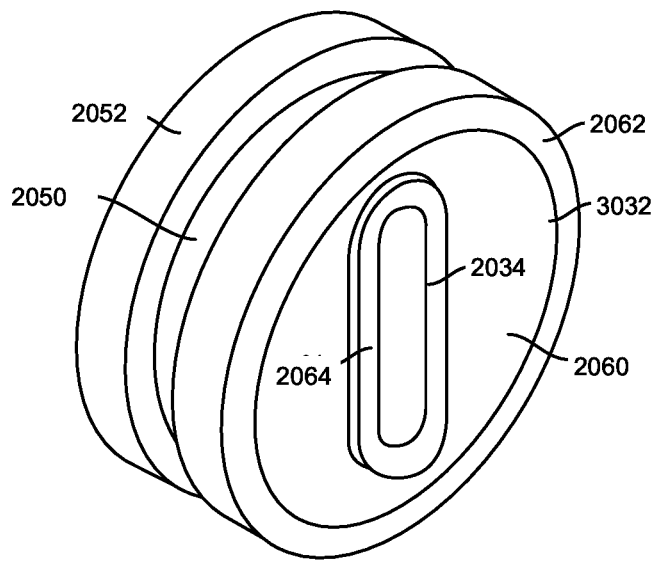
FIG. 19 is a perspective view of the washer of the washer assembly of FIG. 15.
Figure 20:
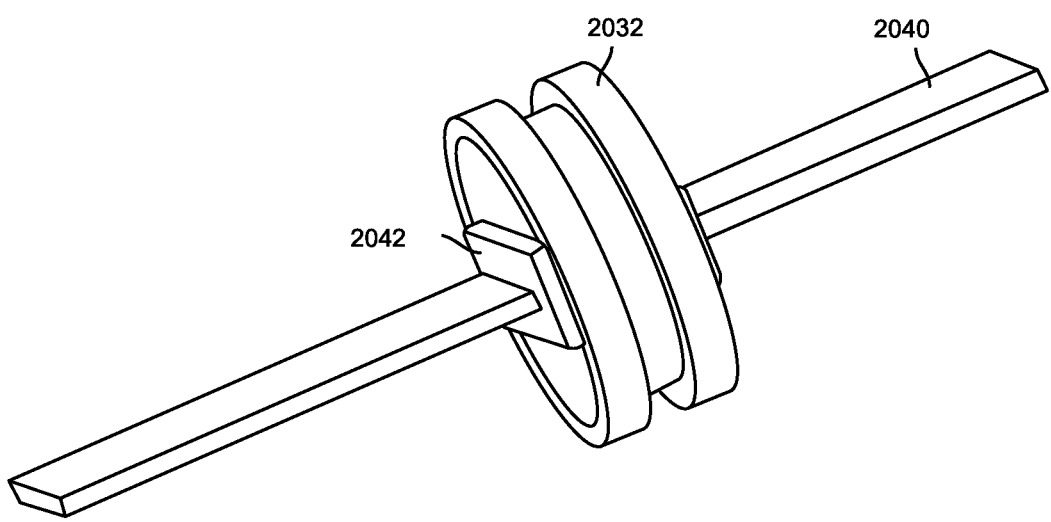
FIG. 20 is a perspective view of the washer assembly of FIG. 15.

As illustrated in FIG. 18, in another embodiment, the central opening 2034 may have an oval or oblong shape.

The washer body 2032 in one embodiment may be disk-shaped. The washer body 2032 may include an annular channel 2050 (FIG. 19) in an outer circumference 2052. In some embodiments, an o-ring (not shown) is disposed in the annular channel 2050. The o-ring may facilitate a seal between the washer body 2032 and the inner diameter 2024 of the hollow connector body 2022.

In the embodiment illustrated in FIGS. 15-20, the washer body 2032 has a thickness tw of between 0.25 in and 1.0 in, preferably approximately 0.4 in. The washer body 2032 may have an outer diameter wd of between 0.5 in and 2 in, preferably approximately 1 in. The central opening 2034 may have an opening length of between 0.2 in and 1.0 in, preferably approximately 0.566 in, and an opening width ow of between 0.01 in and 0.5 in, preferably approximately 0.125 in. The PWB 2040 may have a thickness tp of between 0.02 in and 0.1 in, preferably approximately 0.62 in. The PWB 2040 may have a width wp of between 0.25 in and 1.0 in, preferably approximately 0.5 in. In some embodiments, the washer body 2032 comprises a one piece polyphenylene sulfide radial seal washer, such as a Ryton® seal washer. In some embodiments, the washer body 2032 may include a recessed central face 2060 that is surrounded by a raised annular ring 2062. The central opening 2034 may be surrounded by a raised collar 2064. The raised collar 2064 enhances the connection between the washer body 2032 and the overmolded rubber insert 2042. The disclosed dimensions advantageously facilitate seals between the PWB 2040 and the washer body 2032.

The disclosed connection assemblies may facilitate connections between one or more field devices or sensors and one or more controllers. In some embodiments, the field devices may include one or more interfaces, such as, Fieldbus interfaces, Profibus interfaces, HART interfaces, standard 4-20 ma interfaces, etc. The fielded devices themselves may be smart field devices, such as HART, Profibus, or FOUNDATION™ Fieldbus field devices, which include a processor and a memory, or may be any other desired type of devices. Some of these devices, such as Fieldbus field devices, may store and execute modules, or sub-modules, such as function blocks, associated with the control strategy implemented in the controllers. The field devices and the controllers may be housed in an enclosure having one or more chambers, as described above. Such enclosures are common in a process control environment but are equally common in commercial, retail, residential, automotive, appliance, etc., applications. The controllers may be coupled to one or more host or operator workstations. While the controllers and field devices and may be located within and distributed throughout the sometimes harsh plant environment, in particular environments housing explosive gases, the operator workstations are usually located in control rooms or other less harsh environments easily assessable by controller or maintenance personnel.

The controllers may be, by way of example, DeltaV™ controllers sold by Emerson Process Management. The controllers store and execute controller applications that implement a control strategy using any number of different, independently executed, control modules or blocks. Each of the control modules can be made up of what are commonly referred to as function blocks wherein each function block is a part or a subroutine of an overall control routine and operates in conjunction with other function blocks (via communications called links) to implement process control loops within the process plant. Function blocks, which may be objects in an object oriented programming protocol, typically perform one of an input function, such as that associated with a transmitter, a sensor or other process parameter measurement device, a control function, such as that associated with a control routine that performs PID, fuzzy logic, etc. control, or an output function that controls the operation of some device, such as a valve, to perform some physical function within the process plant.

From the foregoing, it will be appreciated that the above disclosed apparatus, methods and articles of manufacture relate to multiple conductor feed-thrus for use in environments were combustible or explosive gas may be used as a pressure medium. In some examples, the feed-thrus are formed of two materials that are coupled together via adhesive, a press-fit connection, or over molding. If over molding is used, the flange of the seal washer assembly and the body of the seal washer assembly may be coupled together using this technique.

Further, while several examples have been disclosed herein, any features from any examples may be combined with or replaced by other features from other examples. Moreover, while several examples have been disclosed herein, changes may be made to the disclosed examples within departing from the scope of the claims.

What is claimed is:

1. A digital valve controller, comprising:
a main housing having an opening;
a terminal box having a bore, the bore of the terminal box being aligned with the opening of the main housing;
a seal washer assembly disposed within the bore, the seal washer assembly comprising:
a seal washer having a bore;
a pair of inserts disposed within the bore of the seal washer and each comprising a first portion, a second portion, and a groove, a first groove from a first of the pair of inserts and a second groove from a second of the pair of inserts cooperating to form a passage extending between the first portion of the inserts and the second portion of the inserts; and
an electrical coupling extending through the passage formed by the grooves of the inserts.

2. The digital valve controller of claim 1, further comprising potting disposed adjacent the first portion of the inserts and potting disposed adjacent the second portion of the of the inserts.

3. The digital valve controller of claim 2, wherein the potting disposed adjacent the first portion of the inserts provides a gas-seal rating and the potting disposed adjacent the second portion of the inserts provides an explosion-proof rating.

4. The digital valve controller of claim 2, wherein the potting is disposed within the bore of the seal washer adjacent the first portion of the inserts.

5. The digital valve controller of claim 2, wherein the potting disposed adjacent the first portion of the inserts is positioned between the first portion of the inserts and the seal washer.

6. The digital valve controller of claim 1, wherein the seal washer comprises an external groove, further comprising a seal, the seal disposed within the external groove.

7. The digital valve controller of claim 6, wherein the bore of the terminal box comprises an internal surface, and wherein the seal sealing engages the internal surface of the bore of the terminal box.

8. The digital valve controller of claim 1, wherein the seal washer comprises an internal step, and wherein each first portion of the inserts comprises a flange, the flange engaging the internal step of the seal washer.

9. The digital valve controller of claim 8, wherein the internal step faces the main housing.

10. The digital valve controller of claim 1, wherein the electrical coupling is a printed wiring board (PWB).

11. The digital valve controller of claim 1, wherein the passage between the first portion of the inserts and the second portion of the inserts has an oval cross-section.

12. The digital valve controller of claim 1, wherein the groove of each of the inserts comprises radiused corners.

13. The digital valve controller of claim 12, wherein the electrical coupling comprises radiused edges.

* * * * *

UNITED STATES PATENT AND TRADEMARK OFFICE
CERTIFICATE OF CORRECTION

| | | |
|---|---|---|
| PATENT NO. | : 11,408,528 B2 | Page 1 of 1 |
| APPLICATION NO. | : 16/541871 | |
| DATED | : August 9, 2022 | |
| INVENTOR(S) | : Ronald F. Hurd | |

It is certified that error appears in the above-identified patent and that said Letters Patent is hereby corrected as shown below:

In the Specification

At Column 4, Line 65, "over-molding" should be -- overmolding --.

At Column 4, Line 66, "of the washer of the washer" should be -- of the washer --.

At Column 8, Line 51, "disclosed being" should be -- disclosed as being --.

At Column 8, Line 52, "such" should be -- such as --.

At Column 9, Line 36, "may an" should be -- may be an --.

At Column 13, Line 50, "such as," should be -- such as --.

At Column 14, Line 28, "were" should be -- where --.

Signed and Sealed this
Sixteenth Day of April, 2024

Katherine Kelly Vidal
*Director of the United States Patent and Trademark Office*